US009698284B2

(12) United States Patent
Hegedus

(10) Patent No.: US 9,698,284 B2
(45) Date of Patent: *Jul. 4, 2017

(54) INDIVIDUAL FINGER ISOLATION THROUGH SPOT APPLICATION OF A DIELECTRIC IN AN OPTOELECTRONIC DEVICE

(75) Inventor: Andreas Hegedus, Burlingame, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 179 days.

This patent is subject to a terminal disclaimer.

(21) Appl. No.: 13/222,393

(22) Filed: Aug. 31, 2011

(65) Prior Publication Data

US 2013/0048066 A1    Feb. 28, 2013

(51) Int. Cl.
*H01L 31/02* (2006.01)
*H02S 50/10* (2014.01)
*H01L 21/66* (2006.01)
*H01L 31/0224* (2006.01)
*H01L 31/05* (2014.01)
*H01L 31/0216* (2014.01)

(52) U.S. Cl.
CPC ...... *H01L 31/022433* (2013.01); *H01L 22/22* (2013.01); *H01L 31/02168* (2013.01); *H01L 31/0508* (2013.01); *H02S 50/10* (2014.12); *Y02E 10/50* (2013.01)

(58) Field of Classification Search
CPC .... H01L 25/045; H01L 31/05–31/0516; H02S 50/00–50/15
USPC ...................................... 136/243–290; 438/4
See application file for complete search history.

(56) References Cited

U.S. PATENT DOCUMENTS

| 4,443,652 | A | * | 4/1984 | Izu et al. ........................ 136/251 |
| 4,617,420 | A | * | 10/1986 | Dilts et al. ..................... 136/244 |
| 4,746,618 | A | * | 5/1988 | Nath et al. ....................... 438/62 |
| 5,527,717 | A | * | 6/1996 | Inoue .............................. 438/64 |
| 5,569,332 | A | * | 10/1996 | Glatfelter et al. ............. 136/249 |
| 5,973,258 | A | * | 10/1999 | Shiotsuka et al. ............. 136/252 |
| 2006/0180195 | A1 | * | 8/2006 | Luch .............................. 136/244 |
| 2009/0151776 | A1 | * | 6/2009 | Schindler ...................... 136/251 |

(Continued)

FOREIGN PATENT DOCUMENTS

WO    WO 2010023263 A1 *    3/2010

OTHER PUBLICATIONS

"CRC Handbook of Chemistry and Physics, 65th ed.", ed. by R. C. Weast, p. F-76, CRC Press, Inc. (1984).*

*Primary Examiner* — Eric R Smith
(74) *Attorney, Agent, or Firm* — Arent Fox LLP

(57) ABSTRACT

An optoelectronic device including at least one of a solar device, a semiconductor device, and an electronic device. The device includes a semiconductor unit. A plurality of metal fingers is disposed on a surface of the semiconductor unit for electrical conduction. Each of the metal fingers corresponds to a section of the optoelectronic device. A plurality of pad areas is available for connection to a bus bar, wherein each of the metal fingers is connected to a corresponding pad area for forming an electrical contact. The optoelectronic device includes a bad section, wherein the bad section is associated with a compromised metal finger and a compromised pad area. A dielectric spot coating is disposed above the compromised pad area to electrically isolate the bad section.

14 Claims, 13 Drawing Sheets

(56) References Cited

U.S. PATENT DOCUMENTS

2009/0255565 A1* 10/2009 Britt et al. .................... 136/244
2010/0210040 A1* 8/2010 Basol ............................... 438/4

* cited by examiner

INDIVIDUAL FINGER ISOLATION THROUGH SPOT APPLICATION OF A DIELECTRIC IN AN OPTOELECTRONIC DEVICE

RELATED APPLICATIONS

The present application is related to co-pending patent application, entitled "Device and Method For Individual Finger Isolation In An Optoelectronic Device," filed on Aug. 31, 2011, U.S. patent application Ser. No. 13/222,310, and incorporated herein in its entirety.

BACKGROUND

As fossil fuels are being depleted at ever-increasing rates, the need for alternative energy sources is becoming more and more apparent. Energy derived from wind, from the sun, and from flowing water offer renewable, environmentally friendly alternatives to fossil fuels, such as coal, oil and natural gas. Being readily available almost anywhere on Earth, solar energy may someday be a viable alternative.

To harness energy from the sun, the junction of a solar cell absorbs photons to produce electron-hole pairs, which are separated by the internal electric field of the junction not to generate a voltage, thereby converting light energy to electrical energy. One or more solar cells may be combined together on solar panels. An inverter may be coupled to several solar panels to convert direct current power to alternating current power.

The currently high cost of producing solar cells relative to the low efficiency levels of contemporary devices heretofore has presented solar cells from becoming a mainstream energy sources, and has limited the applications to which solar cells may be suited. Compounding the problem are defective solar cells that may be by themselves unusable, but also may render a group of solar cells unusable, especially when the defect is fatal. Accordingly, there is a need for salvaging expensive, yet defective solar cells rather than discarding them.

SUMMARY

Embodiments of the present invention generally relate to devices and methods for converting electromagnetic radiation, such as, solar energy, into electrical energy that are able to isolate defective portions of a solar cell, so that remaining active portions of the solar cell may still be used for energy production.

In one embodiment, an optoelectronic device is disclosed including at least one of a solar device, a semiconductor device, and an electronic device. The device includes a semiconductor unit. A plurality of metal fingers is disposed on a surface of the semiconductor unit for electrical conduction. Each of the metal fingers includes a pad area for forming an electrical contact. The optoelectronic device includes a plurality of pad areas that is available for connection to a bus bar, wherein each of the metal fingers is connected to a corresponding pad area for forming an electrical contact.

In one embodiment, an optoelectronic device comprising a film stack material is configured for electrical connection. The film stack material (e.g., thin film stack, etc.) includes a p-n layer such that electrical energy is created when photons are absorbed by the p-n layer. A plurality of metal fingers is disposed on a surface of the p-n layer for electrical conduction. Each of the metal fingers includes a pad area for forming an electrical contact. A dielectric coating (e.g., anti-reflective coating) is disposed above the plurality of metal fingers and the surface. Also, at least one blind via through the dielectric coating provides access to a corresponding pad area. The film stack material includes at least one pad area that is electrically isolated, such that no blind via is present to provide access to a corresponding isolated pad area. In a separate step, a bus bar is put down and connected to selected pad areas for electrical connection via corresponding blind vias.

In another embodiment, a device is disclosed that includes two or more optoelectronic devices, such as, photovoltaic devices. A first optoelectronic device is included and comprises a first p-n layer such that electrical energy is created when photons are absorbed by the first p-n layer; a first plurality of metal fingers on a surface of the first p-n layer for electrical conduction, wherein each of the metal fingers includes a pad area for forming an electrical contact; a first dielectric coating (e.g., anti-reflective coating) disposed above the first plurality of metal fingers and the surface; a first plurality of blind vias through the first anti-reflective coating, wherein each of the blind vias provide access to a corresponding pad area; and a pad area that is electrically isolated, such that no blind via is present to provide access to the pad area. A second optoelectronic device is included and is overlaid the first optoelectronic device, and comprises a semiconductor device layer; a metal backing layer disposed under the semiconductor device layer; a buffer layer under the metal backing layer; and a second plurality of blind vias filled with electrically conductive material, each of which provide access to the metal backing layer. The plurality of vias is aligned with the first plurality of blind vias to provide electrical connection between pad areas of the first plurality of metal fingers of the first optoelectronic device to the metal backing layer of the second optoelectronic device. However, the metal layer is not electrically connected to the pad area that is electrically isolated.

In still another embodiment, a method for fabricating an optoelectronic device including at least one of a solar device, a semiconductor device, and an electronic device, is disclosed and comprises: providing a semiconductor unit; forming a plurality of metal fingers on a surface of the semiconductor unit for electrical conduction; forming a plurality of pad areas available for connection to a bus bar, wherein each of the metal fingers includes a corresponding pad area for forming an electrical contact; forming a dielectric coating (e.g., anti-reflective coating) disposed above the plurality of metal fingers and the surface; performing an integrity test to determine an integrity of a plurality of sections of the optoelectronic device to distinguish between good sections and bad sections of the optoelectronic device, each section corresponding to one of the plurality of metal fingers; and electrically opening a good section and maintaining electrical isolation of the bad section, wherein the bad section corresponds to a compromised finger metal and compromised pad area.

In another embodiment, an optoelectronic device is disclosed, wherein the device includes at least one of a solar device, a semiconductor device, and an electronic device. The device includes a semiconductor unit. A plurality of metal fingers is disposed on a surface of the semiconductor unit for electrical conduction. Each of the metal fingers corresponds to a section of the optoelectronic device. A plurality of pad areas is available for connection to a bus bar, wherein each of the metal fingers is connected to a corresponding pad area for forming an electrical contact. The optoelectronic device includes a bad section, wherein the bad section is associated with a compromised metal finger and a compromised pad area. A dielectric spot coating is disposed above the compromised pad area to electrically isolate the bad section.

In still another embodiment, a method for fabricating an optoelectronic device including at least one of a solar device, a semiconductor device, and an electronic device, is disclosed and comprises: providing a first semiconductor unit of an optoelectronic device; forming a plurality of metal fingers on a surface of the semiconductor unit for electrical conduction; forming a plurality of pad areas available for connection to a bus bar, wherein each of the metal fingers is connected to a corresponding pad area for forming an electrical contact; performing an integrity test to discover a bad section of a plurality of sections of the optoelectronic device, wherein each section corresponds to one of the plurality of metal fingers; and forming a dielectric spot coating disposed over a compromised pad area associated with the bad section of the first optoelectronic device to electrically isolate the bad section.

These and other objects and advantages of the various embodiments of the present disclosure will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

DETAILED DESCRIPTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Accordingly, embodiments of the present disclosure illustrate an optoelectronic device (e.g., a photovoltaic device) that includes a plurality of metal fingers available for connection to an external bus bar, wherein one of the metal fingers is electrically isolated to reduce or eliminate the effects of a manufacturing defect. In that manner, a defect in an optoelectronic device may be electrically isolated, thereby restoring the integrity of a previously defective device, though at reduced operational power.

Embodiments of the present invention are described within the context of providing electrical isolation of a metal finger of an optoelectronic device. Examples of such optoelectronic devices include but are not limited to photovoltaic devices, solar devices, semiconductor devices, and any electronic devices (e.g., diodes, light emitting diodes (LEDs), etc.).

Figure 1A:
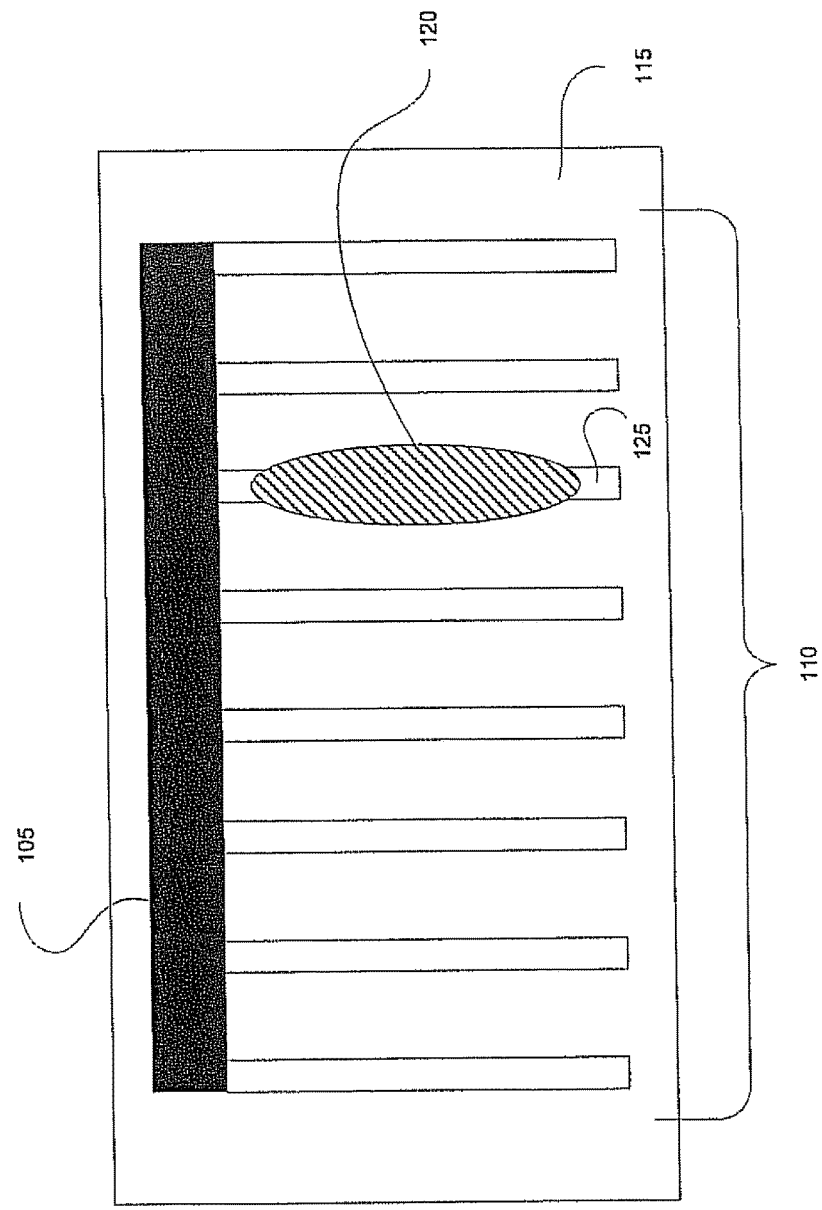
FIG. 1A is a plan view of an optoelectronic device showing an integrated bus bar connected to a plurality of metal fingers and a potentially fatal defect.
Figure 1B:
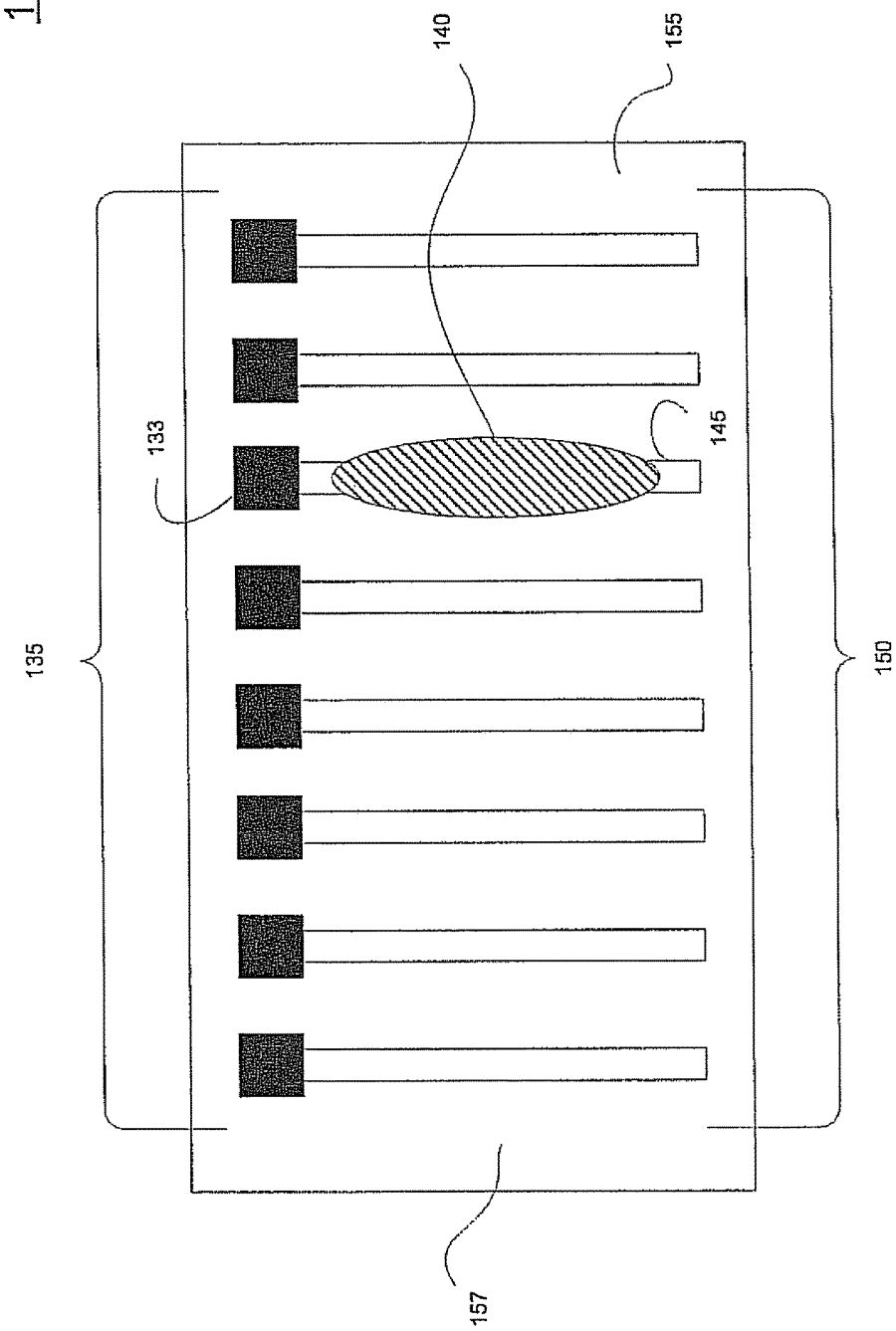
FIG. 1B is a plan view of an optoelectronic device showing a segmented bus bar connected to a plurality of metal fingers and a defect, in accordance with one embodiment of the present disclosure.
Figure 1C:
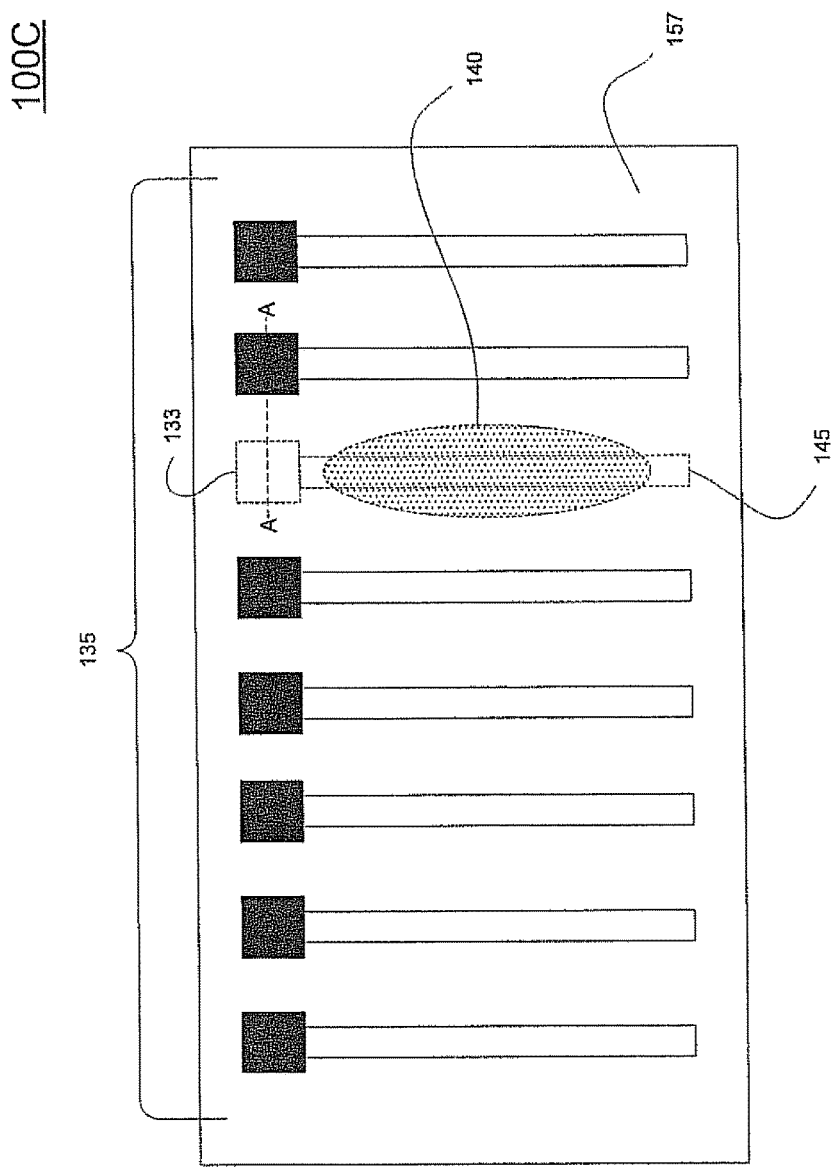
FIG. 1C is a plan view of an optoelectronic device showing a segmented bus bar connected to a plurality of metal fingers and an isolated metal finger that is associated with a defect, in accordance with one embodiment of the present disclosure.

FIG. 1A-C are diagrams of optoelectronic devices including a potentially fatal defect that through embodiments of the present invention are electrically isolated. The defects in the optoelectronic devices may range in severity from inconsequential to severe, and stem from imperfect manufacturing techniques. An inconsequential defect has little or no affect on the operation of the device. On the other hand, a potentially fatal defect severely and negatively impacts the operation of the device. For instance, a fatal defect may describe a short from a metal finger to an underlying metal layer of the device that does not allow current to flow to an external load for power capture. Typically, any discoverable defect in a device would render that device unusable as the chance that the defect be fatal may compromise the overall integrity of a solar panel including multiple devices, including the defective device. However, embodiments of the present invention are configurable to isolate the defect, no matter the severity, thereby restoring the integrity of the device for operational use.

In particular, FIG. 1A illustrates a plan view of an optoelectronic device 100A showing an integrated bus bar 105 connected to a plurality of metal fingers 110 and a potentially fatal defect 120. The plurality of metal fingers 110 is adjacent to a p-n layer 115 that generates electrical energy (e.g., current) when photons are absorbed. In addition, a defect 120 is shown that is in the proximity of metal finger 125. Because the bus bar 105 is contiguous, the defect 120 that adversely affects metal finger 125 is able to affect all of the plurality of metal fingers 110 through the bus bar 105. As such, if the defect is severe, such as, a short connecting both sides of the underlying p-n junction, then that defect will affect the entire device 100A, thereby rendering the device 100A defective.

FIG. 1B is a plan view of an optoelectronic device showing a plurality of metal fingers 150 available for connection to a bus bar (not shown), in accordance with one embodiment of the present disclosure. The plurality of metal fingers 150 is adjacent to a semiconductor unit 155 having a surface 157. For instance, in one embodiment, the semiconductor unit 155 comprises an underlying p-n layer that generates electrical energy (e.g., current) when photons are absorbed.

More particularly, each of the plurality of metal fingers 150 is isolated from the other fingers. For instance, instead of having a contiguous bus bar as a layer that connects to all of the plurality of metal fingers 150, a plurality of electrically conductive landing pads 135 is disposed adjacent to the plurality of metal fingers 150 that is available for connection to the bus bar. In particular, a landing pad is disposed adjacent to a corresponding metal finger. As will be described later, the landing pads can then be connected together through any suitable means, such as, via conductive leads, or as will be further described below, to an external bus bar, or to a metal plate acting as an external bus bar of an adjoining device.

In addition, a defect 140 is shown that is in the proximity of metal finger 145. Because of the configuration of the landing pads 135 and its connection to an external bus bar, the defect 140 is isolated to metal finger 125, through embodiments of the present invention. In particular, isolation is achieved by electing not to connect landing pad 133, that is connected to metal finger 145, to the remaining plurality of landing pads 135 through an external bus bar.

For instance, FIG. 1C is a plan view of an optoelectronic device 100C showing the isolation of a metal finger, in accordance with one embodiment of the present disclosure. The device 100C takes the defect 140 present in the device 100B of FIG. 1B, and isolates that defect in order to restore the operational integrity of the device 100C. In particular, the defect 140 is shown again in the proximity of metal finger 145, and adversely affects the purposeful operation of metal finger 145. However, landing pad 133 that is connected to metal finger 145 is shown in FIG. 1C as being isolated (e.g., not filled in) from the remaining landing pads. Isolation of landing pad 133 is achieved by maintaining a dielectric layer disposed over the surface 157 of the semiconductor layer over pad 133 such that no electrical connectivity is made to an external bus bar, and is described further in relation to FIGS. 2A-B and 3 below. Moreover, one or more landing pads associated with one or more defects may be electrically isolated from the remaining landing pads. In that manner, the landing pads in the plurality of landing pads 135 that are not isolated (e.g., filled in) can then be connected together through any suitable means, such as, through conductive leads, an external bus bar, or as will be further described below, to a metal plate of an adjoining device acting as an external bus bar.

Figure 2A:
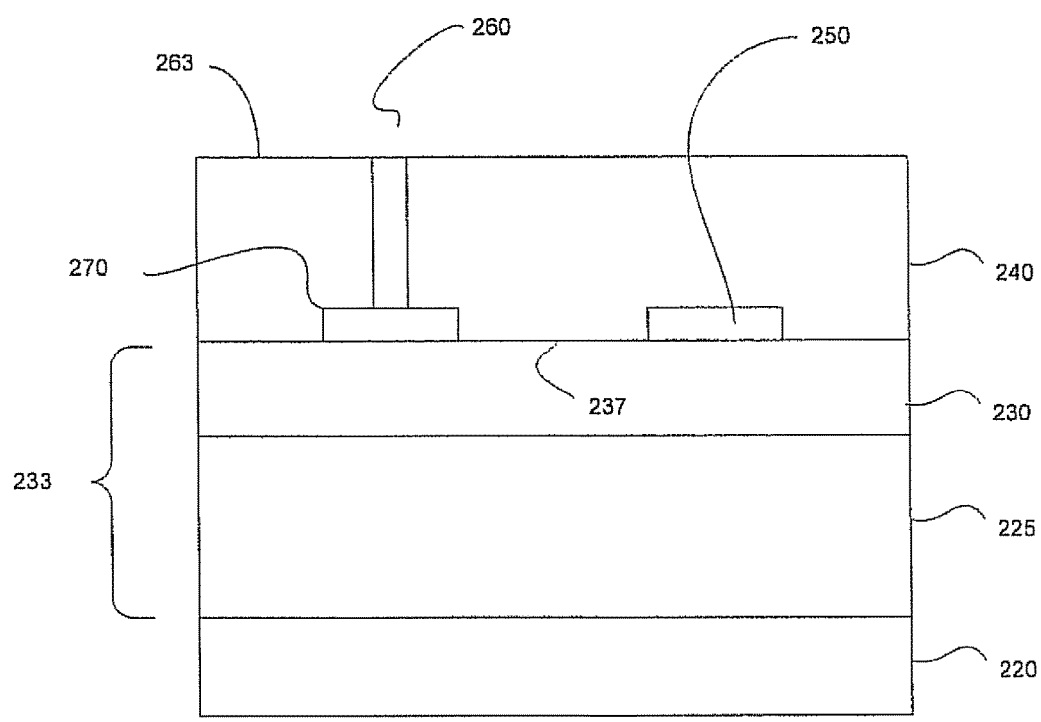
FIG. 2A is a cross-sectional view of an optoelectronic device showing an isolated metal finger, in accordance with one embodiment of the present disclosure.

FIG. 2A is a cross-sectional view of an optoelectronic device 200A (e.g., a solar/photovoltaic device, a semiconductor device, an electronic device, etc.) showing an isolated metal finger, in accordance with one embodiment of the present disclosure. Device 200A may be representative of any semiconductor device, such as, a solar cell, light emitting diode (LED), etc. For instance, the cross-section shown in FIG. 2A may be representative of a portion of the device 100C shown in FIG. 1C that is taken along lines A-A. In particular, FIG. 2A illustrates various epitaxial layers of the device 200A in cross-section during fabrication. The various layers may be formed using any suitable method for semiconductor growth, such as, molecular beam epitaxy, or metal-organic chemical vapor deposition, on a substrate (not shown).

As shown, in FIG. 2A, at least one layer 220 may perform one or more functions. For instance, layer 220 may provide a buffer for protection, mechanical support, electrical contact, a window, and/or optical reflection, to name a few. In addition, layer 220 may include multiple layers that are grown and removed during the fabrication process. In this manner, embodiments of the present invention may be fabricated by performing epitaxial lift off (EPO) for removing various layers.

As shown, a semiconductor unit 233 is disposed over layer 220. The semiconductor unit includes one or more active components each performing a function. In one embodiment, semiconductor unit 233 comprises a p-n layer that generates electrical energy (e.g., current) when photons are absorbed by the p-n layer. In the p-n layer, a base layer 225 is grown, and an emitter layer 230 is grown adjacent to the base layer. The combination of the base layer and the emitter layer forms a heterojunction that acts as an absorber layer or p-n layer 233 for absorbing photons. In various embodiments, the emitter and base layers may be n-doped or $p^+$-doped in various combinations. For instance, in one embodiment, emitter layer 230 is a $p^+$-doped layer with a surface 233, and adjacently disposed base layer 225 is n-doped. In another embodiment, emitter layer 230 is an n-doped layer with surface 233, and adjacently disposed base layer 225 is $p^+$-doped. In particular, when light is absorbed near the p-n layer 233 to produce electron-hole pairs, the built in electric field may force the holes to the n-doped side and electrons to the $p^+$-doped side. This displacement of free charges results in a voltage difference between the two layers in the p-n layer 233 such that electron current may flow when a load is connected across terminals or contact regions (not fully shown) coupled to these layers. The various thicknesses and relational dimensions of the multiple layers in device 200A of FIG. 2A, as well as the other figures in this Application, and may vary between devices.

A plurality of metal fingers (not shown) is disposed on a surface 237 of the semiconductor unit 233 for electrical conduction, as described above. More particularly, each of the metal fingers includes a landing pad area for forming an electrical contact. The plurality of pad areas may be electrically connected together through any suitable means, such as, an external bus bar, leads, etc.

Layer 240 is shown disposed on top of surface 237 of the semiconductor unit 233. Layer 240 includes material forming a dielectric. In one embodiment, the dielectric comprises an anti-reflective coating (ARC) to reduce the reflection of photons incident on the semiconductor unit 233. In one implementation, where the semiconductor unit 233 comprises a p-n layer the ARC layer helps to increase the number photons absorbed by the p-n layer. As such, the metal fingers and pad areas are partially surrounded by the layer 240.

As shown in FIG. 2A, pad area 270 is connected to a via (e.g., blind via) 260 that is filled with electrically conductive material. Via 260 is formed within layer 240, and is exposed through top surface 263. Any suitable means for creating a via may be used, such as, through laser or other types of abrasion, chemical process formation, etc. In that manner, pad area 270 may be electrically connected to other similarly accessible pad areas of the device 200A through an external bus bar (not shown).

In addition, pad area 250 is also shown in FIG. 2A. Pad area 250 is not connected to a via or blind via, and as such is electrically isolated. That is, pad area 250 cannot be electrically coupled to other pad areas through an external bus bar (not shown). In that manner, any defect in the device that propagates through the metal finger connected to the pad area 250 cannot further propagate to the other metal fingers of the device.

Figure 2B:
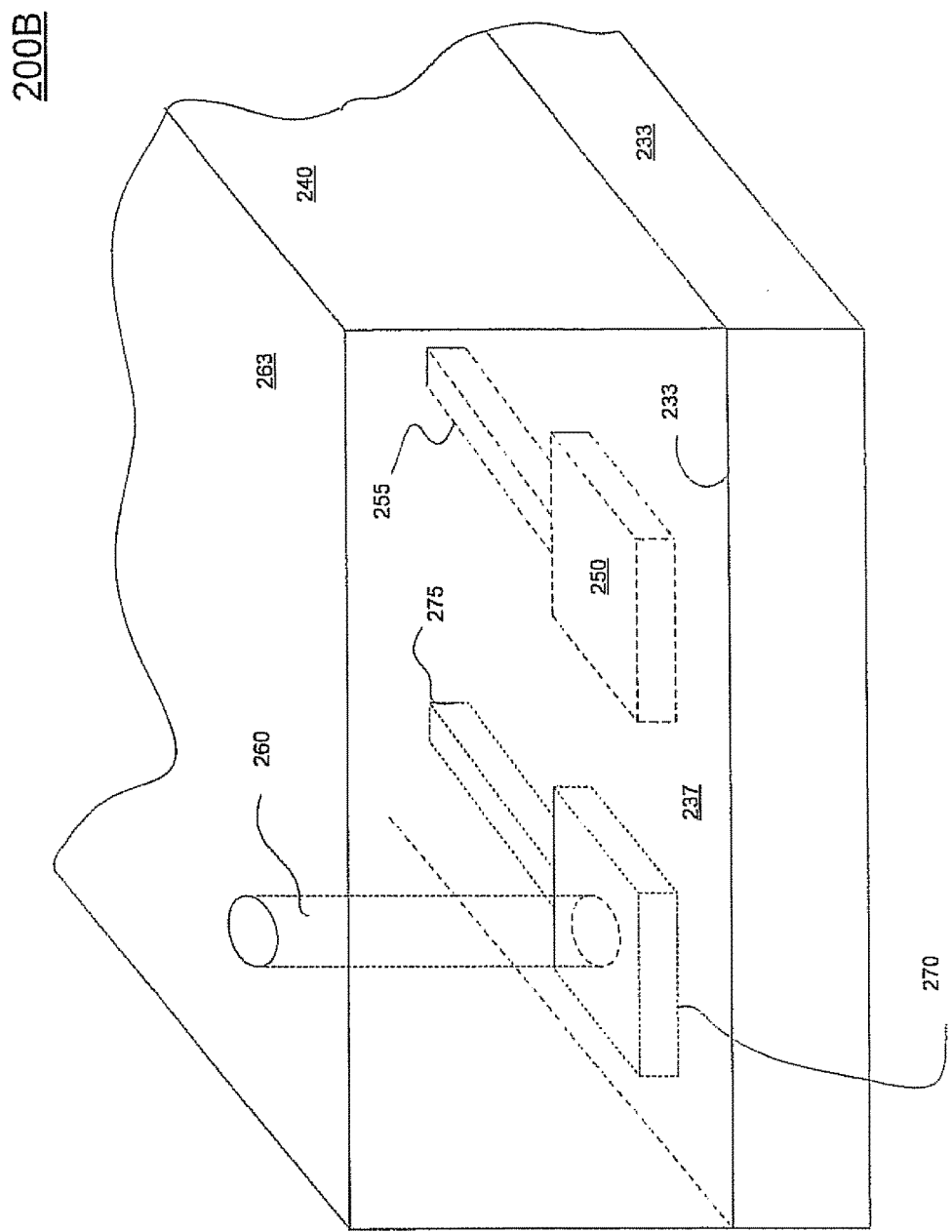
FIG. 2B is a cross-sectional view of an optoelectronic device including a back plate metal layer, and showing an isolated metal finger, in accordance with one embodiment of the present disclosure.

FIG. 2B illustrates a perspective view of an optoelectronic device 200B showing an isolated metal finger, in accordance with one embodiment of the present disclosure. In one embodiment, optoelectronic device 200B provides another view of device 200A of FIG. 2A. As shown, pad area 270 is connected to metal finger 275, wherein metal finger 275 is electrically coupled to the surface 237 of the semiconductor unit 233. Blind via 260 is shown within layer 240 and is exposed at top layer 263. In that manner, further connections may be made to other pad areas of the device through corresponding vias and through a bus bar (e.g., external bus bar).

Additionally, pad area 250 is shown connected to metal finger 255, wherein metal finger 255 is electrically coupled to the surface 237 of semiconductor unit 233. Pad area 250 is electrically isolated in that no via is connected to the pad area 250. As such, metal finger 255 and metal pad 250 cannot be electrically coupled to other pad areas and metal fingers of device 200B.

Figure 2C:
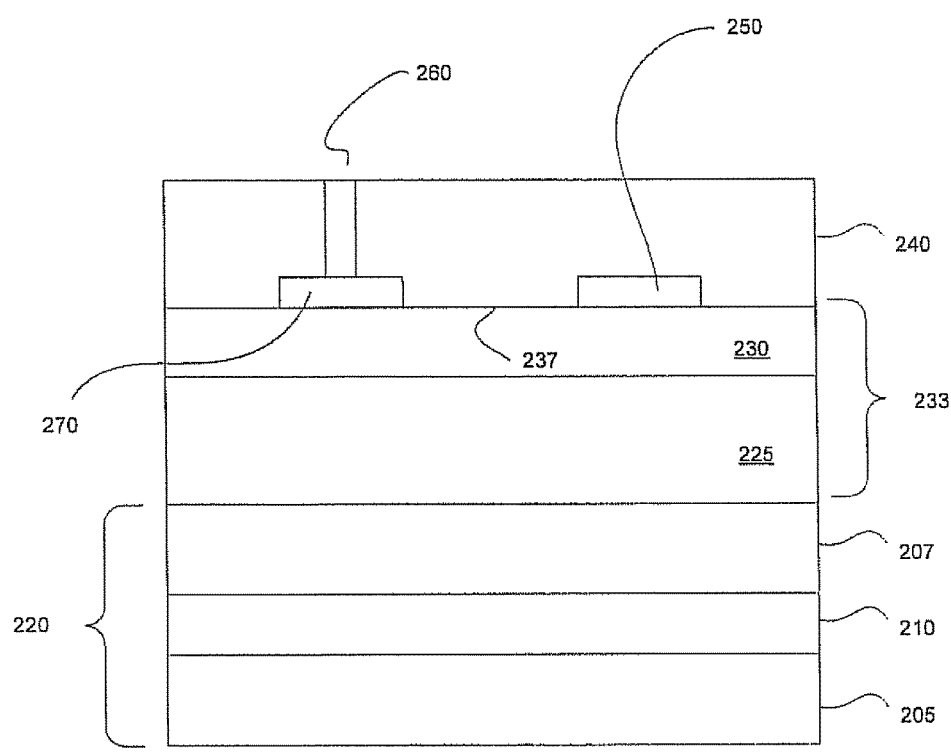
FIG. 2C is a perspective view of the optoelectronic device of FIG. 2A showing an isolated metal finger, in accordance with one embodiment of the present disclosure.

FIG. 2C is a cross-sectional view of various layers of an optoelectronic device 200C (e.g., a solar/photovoltaic device, a semiconductor device, an electronic device, etc.) showing an isolated metal finger, in accordance with one embodiment of the present disclosure. For instance, the cross-section shown in FIG. 2C may be representative of a portion of the device 100C shown in FIG. 1C that is taken along lines A-A. In particular, FIG. 2C illustrates various epitaxial layers of the device 200B in cross-section during fabrication. The various layers may be formed using any suitable method for semiconductor growth, such as, molecular beam epitaxy, or metal-organic chemical vapor deposition, on a substrate (not shown).

In particular, device 200C expands on layer 220 of device 200A of FIG. 2A. For instance, layer 220 may include buffer layers 205 and 207 surrounding a metal layer 210. These layers are disposed below the semiconductor unit p-n layer. In one embodiment, metal layer 210 may be electrically coupled to a plurality of landing pad areas of an underlying optoelectronic device. In that manner, the overlaid pads are configured in series for building voltage. As such, a fabric of optoelectronic devices is created, wherein the plurality of landing pad areas are all electrically coupled through corresponding metal layers.

Figure 3:
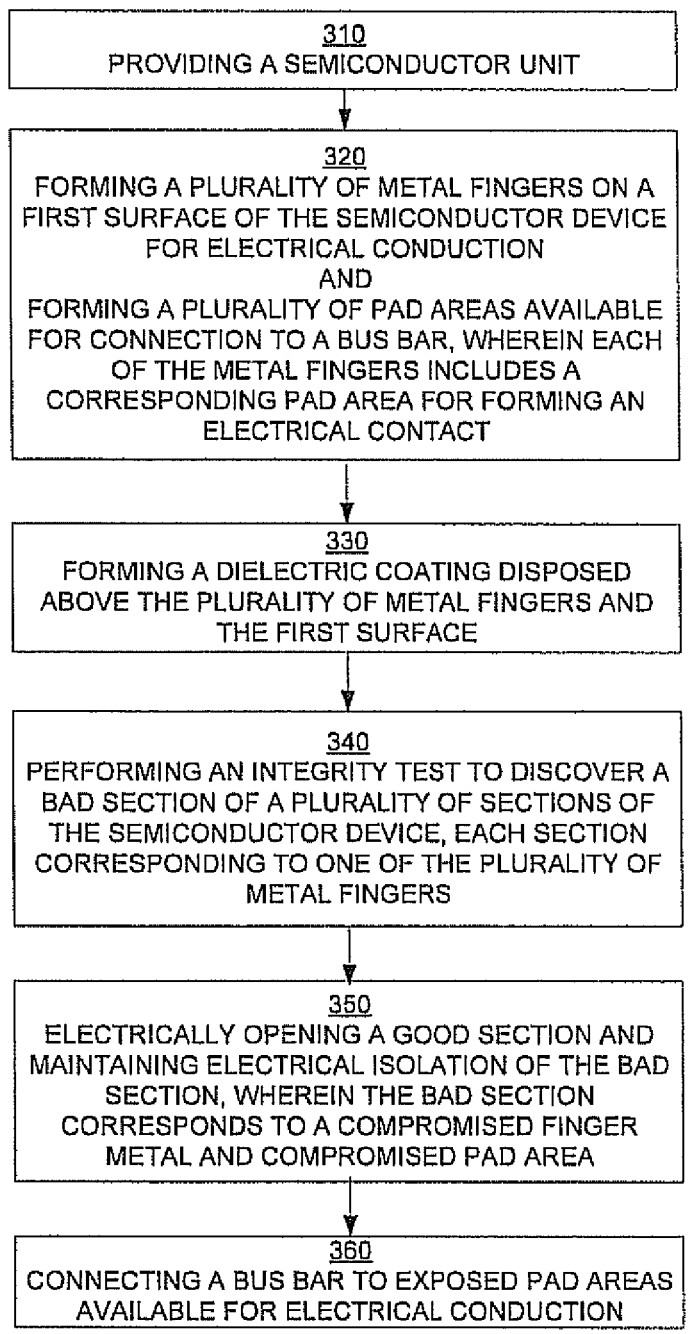
FIG. 3 is a flow chart of a method for fabricating an optoelectronic device including a plurality of landing pad areas connected to a plurality of metal fingers and an isolated metal finger that is associated with a defect, in accordance with one embodiment of the present disclosure.

FIG. 3 is a flow chart 300 of a process used for fabricating an optoelectronic device (e.g., solar/photovoltaic device, a semiconductor device, an electronic device, etc.) that allows for an electrically conductive metal finger to be electrically isolated, in accordance with one embodiment of the present disclosure. In that manner, defects of the thin film stack material and/or device may be electrically isolated.

At 310, a semiconductor unit is provided. In one embodiment, the semiconductor unit comprises a p-n layer such that electrical energy is created when photons are absorbed by the p-n layer. The device may be representative of any optoelectronic device, such as, a semiconductor device, a photovoltaic device or solar cell, LED, etc.

At 320, a plurality of metal fingers is formed on a first surface of the semiconductor unit for electrical conduction. For instance, in the case where the semiconductor unit comprises a p-n layer, the metal fingers provide electrical conduction so that electrical energy may be collected from the excitation of the p-n layer. Specifically, electron current may flow from the p-n layer in response to the absorption of photon energy through the plurality of metal fingers, when a load is connected to terminal or contact regions coupled to the layers of the p-n layer.

A plurality of landing pad areas is also formed. Each of the pad areas is connected to a corresponding metal finger, and provides for forming an electrical contact that is associated with the metal finger. In that manner, connections can be made to the pad areas to electrically couple the metal fingers together. Further, the landing pad areas are available for connection to a bus bar (e.g., external or internal bus bar). In one embodiment, the pad areas are formed simultaneous with the formation of the metal fingers.

At 330, a buffer layer or dielectric coating is disposed over the plurality of metal fingers and the surface of the semiconductor unit. Specifically, a dielectric coating is disposed above the plurality of metal fingers, their corresponding pad areas, and the surface of the semiconductor unit. In one embodiment, the dielectric coating is an anti-reflective coating. In that manner, the dielectric coating partially surrounds the metal fingers and their corresponding pad areas. For instance, the dielectric coating comprises an ARC coating to aid in the absorption of photon energy. Additionally, the dielectric coating is used to electrically isolate a metal finger and a connected pad area from other metal fingers and pad areas of the device, as will be described below.

At 340, the operational integrity of the device is tested. In particular, an integrity test is performed to determine the operational integrity of a plurality of sections of the device. Each section of the device corresponds to one of the plurality of metal fingers. As such, through the test a defect in any section is readily discoverable through the performance of the integrity test. The bad or defective section is associated with a finger metal and corresponding pad area, identified as compromised finger metal and compromised pad area. Additionally, locational or dimensional characteristics are calculated in order to identify the location of the bad section, defect, corresponding compromised pad area, or corresponding compromised finger metal.

Various tests may be performed to check the operational integrity of the device. For instance, in one embodiment, the device may be exposed to a photoluminescence operation, such that a section containing a defect will emit a wavelength that is different from the wavelengths emitted from sections that do not contain a defect. In that manner, the bad section is marked through photoluminescence. In another embodiment, the sections may be tested by electrically stimulating each of the plurality of metal fingers that are associated with the plurality of sections to identify a bad section. Specifically, if there is a short in a bad section, by stimulating the metal finger associated with that bad section, current will flow through that short. As such, the presence of electrical conduction in a section indicates that it is a bad section. In still another embodiment, an image of the device may be taken during fabrication. Certain defects will exhibit identifiable characteristics that are visible through imaging. In that manner, once that characteristic is discovered for a particular section of a device, that section is then associated with having a defect.

At 350, once a bad section is discovered, that section is electrically isolated. In particular, a corresponding portion of the dielectric coating that partially surrounds the compromised finger metal and compromised pad area is left intact. That is, instead of removing the portion of the dielectric coating to provide for conductive access the underlying pad area, it is left intact, in order to maintain the electoral isolation of the compromised pad area. In that manner, the compromised finger metal and compromised pad area remain encapsulated by the dielectric coating.

As such, during the fabrication process one or more pad areas are exposed for electrical conduction by removing corresponding portions of the dielectric coating. The removed portions form a plurality of blind vias that are then filled with electrically conductive material to provide for conductive access to the metal fingers. For instance, blind vias may be created through laser ablation, in which a laser is directed to abrade or remove portions of the dielectric coating in order to access corresponding pad areas. In particular, pad areas associated with good sections of the device are configured for conductive access and/or coupling. Alternatively, bad sections are isolated by skipping the step of removing the corresponding portion of the anti-reflective coating. For instance, the laser is not directed to the location exposing the compromised pad area, and as such, the compromised pad area remains encapsulated by the anti-reflective coating.

In still another embodiment, the compromised metal finger and/or compromised metal pads are removed. For instance, during the laser removal process, instead of just removing corresponding portions of the dielectric coating, the laser is used to remove the compromised metal finger and compromised metal pads. In that manner, no electrical connection can be made to the corresponding metal fingers.

In still another embodiment, the identification of a defective section and isolation of that section is performed before formation of the dielectric coating. In that case, when a defective section is discovered, a buffer material, or electrically isolating material may be formed over the compromised metal finger and compromised pad area to encapsulate those two items over the surface of the p-n layer. Thereafter, the fabrication steps continue, such as, forming an anti-reflective coating, etc.

At 360, a bus bar is connected to the exposed pad areas available for electrical conduction and that are associated with good sections of the device. In one embodiment, the bus bar is a metal layer of an overlying device that is accessible through the backside of the overlying device.

Figure 4A:
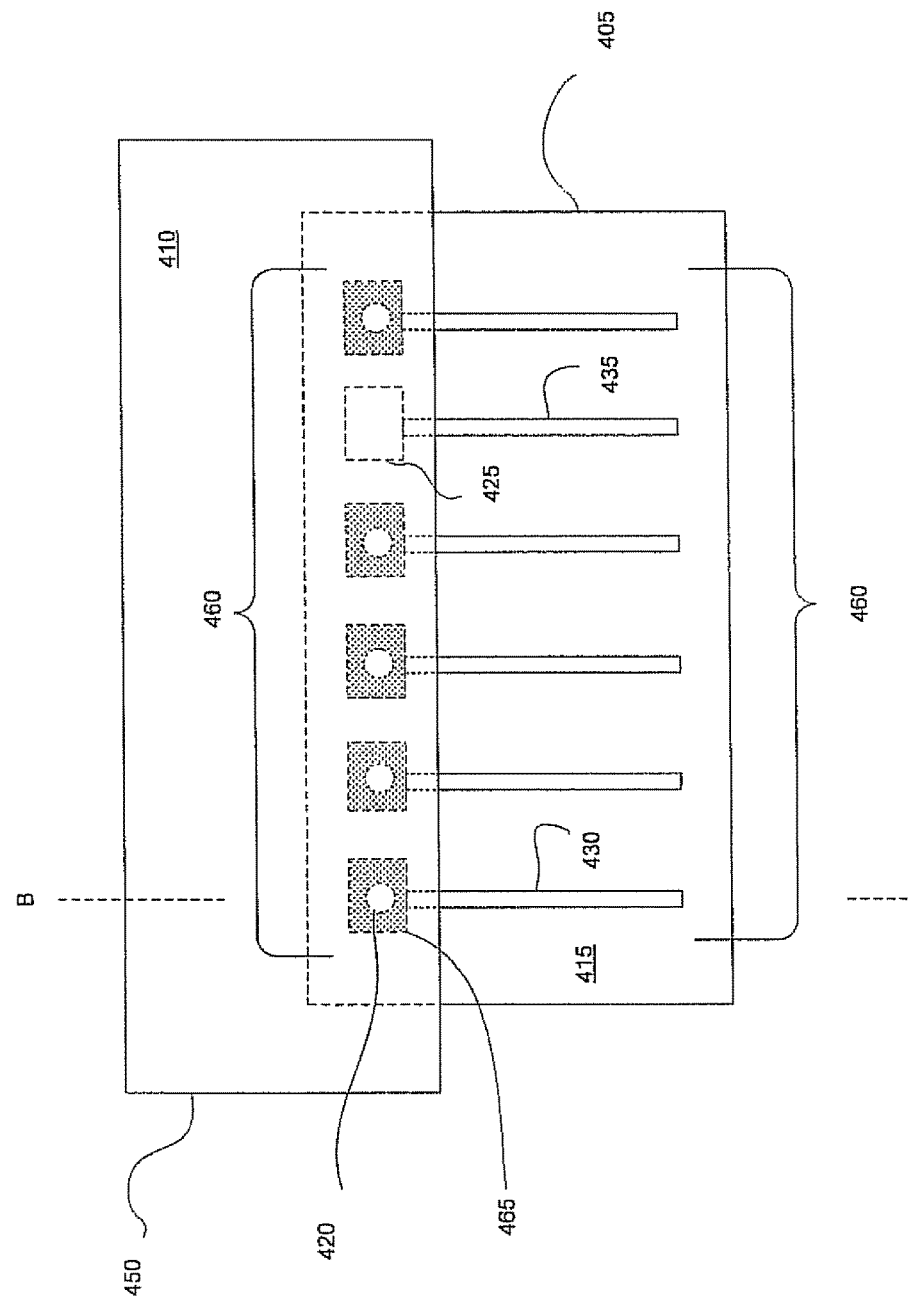
FIG. 4A is a plan view of a fabric including one or more interconnected optoelectronic devices, including one optoelectronic device that comprises a segmented bus bar connected to a plurality of metal fingers and an isolated metal finger that is associated with a defect, in accordance with one embodiment of the present disclosure.

FIG. 4A is a plan view of a fabric 400 including one or more interconnected optoelectronic devices, including one device 450 that comprises a metal layer acting as a bus bar that is connected to a plurality of metal fingers 460 of an underlying device 405, in accordance with one embodiment of the present disclosure. The underlying device 405 includes an electrically isolated metal finger 435 that is associated with a defect, and that is not connected to the bus bar, in accordance with another embodiment of the present disclosure. Although FIG. 4A shows two devices 405 and 450 interconnected in series to build voltage, it is contemplated that more than two devices may be interconnected in similar fashion to create a larger fabric. Also, in other embodiments, devices may be interconnected in parallel through one or more external bus bars for building current.

As shown in FIG. 4A, device 405 includes a plurality of metal fingers 460 that is disposed on a surface 415 of a semiconductor unit for electrical conduction. More particularly, each of the metal fingers is connected to a corresponding landing pad area (pixilated) for forming an electrical contact. For instance, pad area 465 is connected to metal finger 430. In addition, pad area 425 is connected to metal finger 435.

The plurality of pad areas 460 is available for connection to an external bus bar, as previously described. As shown in FIG. 4A, the external bus bar is included in device 420, such as, a metal layer in device 420. Pad areas in the device 405 may be electrically connected and/or coupled together. For instance, a blind via filled with electrically conductive material extends from a surface 415 of the device 405 down to a corresponding pad area. For instance, via 420 is connected to landing pad area 465. By connecting to respective vias connected to underlying pad areas, electrical current will flow to be converted to energy and power.

In embodiments of the present invention, pad area 425 is electrically isolated from the remaining pad areas when coupling to an external bus bar of device 450. As shown pad area 425 is not pixilated to indicate its isolation. Specifically, pad area 425 is not connected to a corresponding via. As such, pad area 425 is not electrically accessible through the surface 415 of device 400A, as are the remaining pad areas in the segmented bus bar, and thus cannot be connected and/or electrically coupled to the remaining pad areas through the external bus bar of device 450.

Figure 4B:
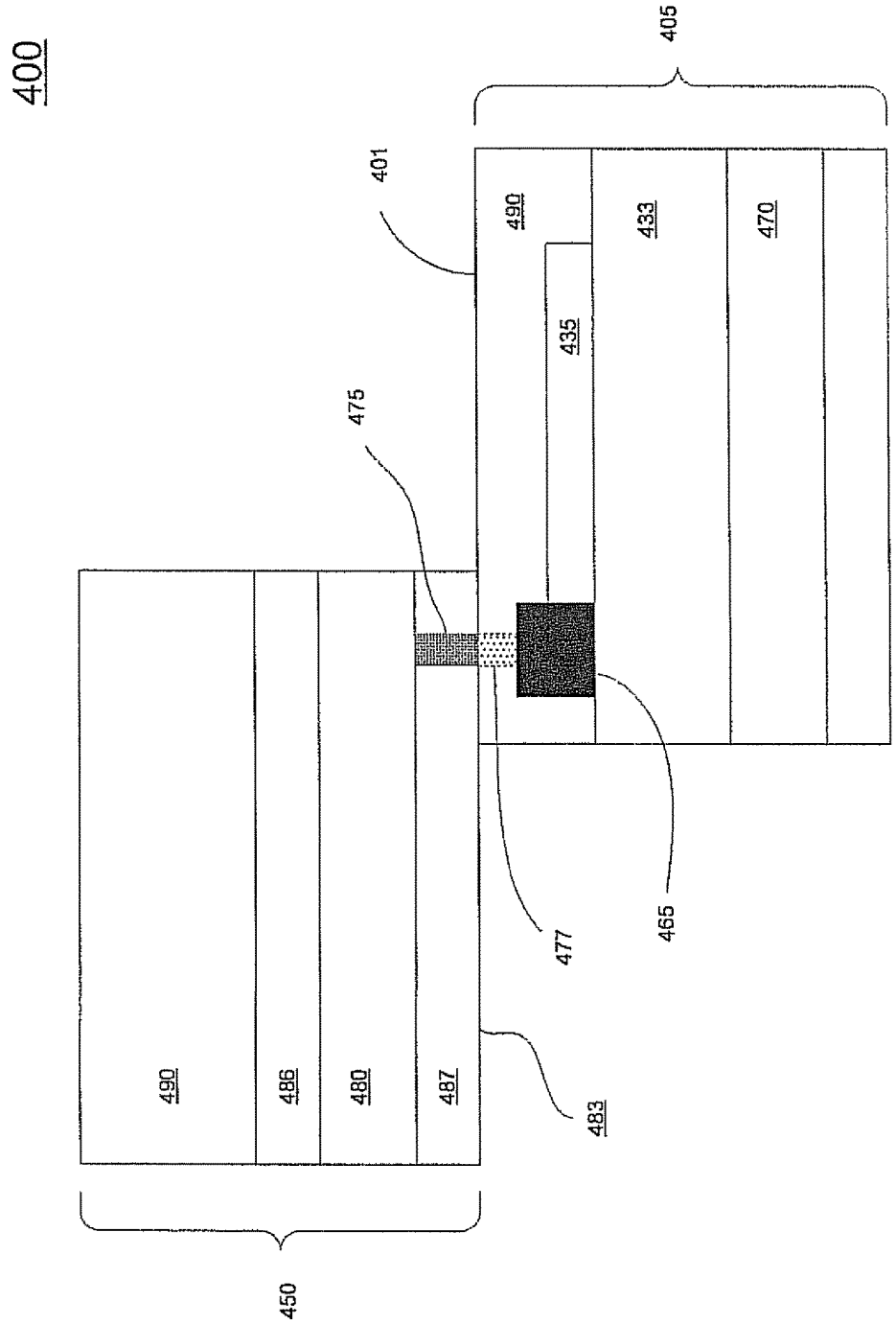
FIG. 4B is a cross-sectional view of the fabric of FIG. 4A illustrating one or more interconnected optoelectronic devices, including one optoelectronic device that comprises a segmented bus bar connected to a plurality of metal fingers and an isolated metal finger that is associated with a defect, in accordance with one embodiment of the present disclosure.

FIG. 4B is a cross-sectional view of the fabric 400 of FIG. 4A illustrating one or more interconnected optoelectronic devices, including one device that comprises a plurality of metal fingers configured for electrical conduction, and an isolated metal finger that is associated with a defect, in accordance with one embodiment of the present disclosure. In particular, the cross-section is taken along line B-B as shown in FIG. 4A.

As shown in FIG. 4B, underlying device 405 includes a pad area 465 that is connected to metal finger 435 that is adjacent to a semiconductor unit 433, such as, a p-n layer. In the case where the unit 433 comprises a p-n layer, electrical energy is created when photons are absorbed by the p-n layer. The pad area 465 and metal finger are encapsulated by a buffer layer 490 (e.g., an anti-reflective coating). Blind via 477 is connected to the pad area 465 and is exposed to the surface 401 of device 405. In that manner, pad area 465 is electrically coupled with other pad devices through their respective vias and an external bus bar, such as, the metal layer 480 of overlaid device 450.

In addition, device 405 includes an electrically isolated pad area (not shown in FIG. 4B), that was previously shown in FIG. 4A. Isolation is achieved by not forming a blind via to the isolated pad area. In that manner, the pad area remains encapsulated by the buffer layer 490 so that it is electrically isolated.

Furthermore, device 450 is shown partially overlapping the device 405. Device 450 is similarly configured as device 405, and both are not fully drawn out for clarity. For instance, device 450 includes a semiconductor device layer 490 (e.g., LED, p-n layer, etc.). Device 450 also includes a metal backing layer 480 disposed under the semiconductor layer 490. A first buffer layer 486 is disposed between the metal backing layer 480 and the semiconductor unit 490. A second buffer layer 487 is disposed under the metal layer 480.

Also, a plurality of blind vias is filled with electrically conductive material, and provides access to the metal backing layer 480 through buffer layer 487 in device 450. The plurality of vias is aligned with the plurality of blind vias providing access to the plurality of pad areas of the underlying device 405. Moreover, the metal layer is not connected to the pad area in device 405 that is electrically isolated (not shown in FIG. 4B). For instance, blind via 475 extends from a bottom surface 483 of device 405 and through the buffer layer 487. Blind via 475 is connected to metal layer 480. Metal layer 480 provides an electrically conductive path for electron flow from each of the coupled pad areas of the underlying device 405. For instance, metal layer 480 is electrically coupled to and connected to pad area 465 through vias 475 and 477. In that manner, metal layer 480 of the overlapping device 450 electrically connects and/or couples each of the plurality of pad areas and corresponding metal fingers of the underlying device 405 through corresponding combination of vias. Further, electrically isolated fingers of device 405 are not connected to the overlaid metal layer 480, and as such remain electrically isolated from the remaining pad areas of device 405.

Figure 5A:
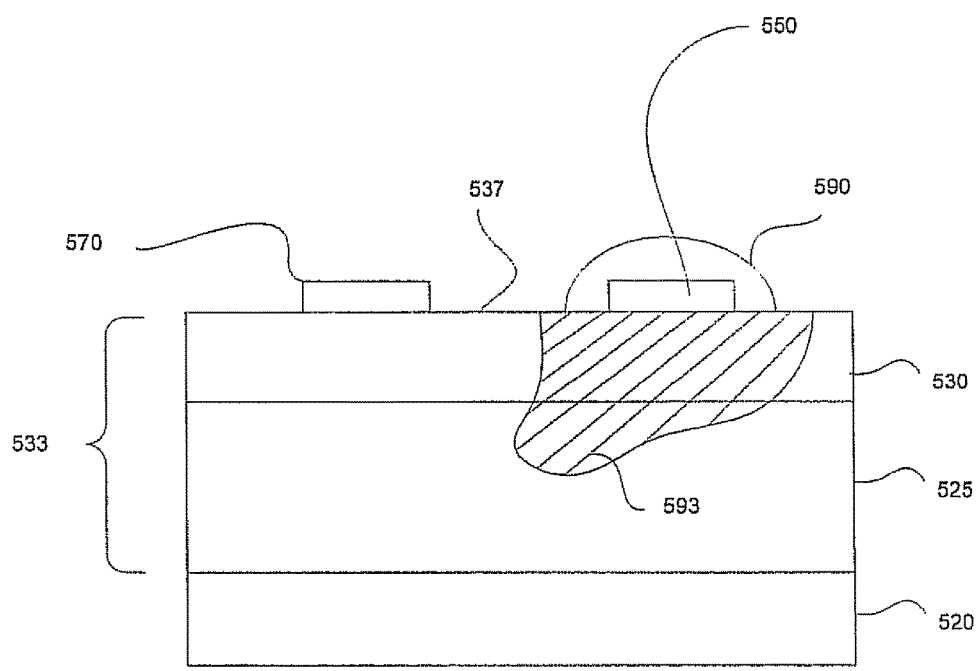
FIG. 5A is a cross-sectional view of an optoelectronic device showing an isolated metal finger and the spot application of a dielectric disposed over a pad area associated with the isolated metal finger, in accordance with one embodiment of the present disclosure.

FIG. 5A is a cross-sectional view of an optoelectronic device 500A showing an isolated metal finger and the spot application of a dielectric disposed over a pad area associated with the isolated metal finger, in accordance with one embodiment of the present disclosure. Device 500A is representative of any solar/photovoltaic device, solar cell, a semiconductor device, diode, light emitting diode (LED), an electronic device, etc. For instance, the cross-section shown in FIG. 5A may be representative of a portion of the device 100C shown in FIG. 1C that is taken along lines A-A. In particular, FIG. 5A illustrates various epitaxial layers of the device 500A in cross-section during fabrication. The various layers may be formed using any suitable method for semiconductor growth, such as, molecular beam epitaxy, or metal-organic chemical vapor deposition, on a substrate (not shown).

As shown, in FIG. 5A, at least one layer 520 may perform one or more functions. For instance, layer 520 may provide a buffer for protection, mechanical support, electrical contact, a window, and/or optical reflection, to name a few. In addition, layer 520 may include multiple layers that are grown and removed during the fabrication process. In this manner, embodiments of the present invention may be fabricated by performing epitaxial lift off (EPO) for removing various layers.

As shown, a semiconductor unit 533 is disposed over layer 520. The semiconductor unit includes one or more active components each performing a function. In one embodiment, semiconductor unit 533 comprises a p-n layer that generates electrical energy (e.g., current) when photons are absorbed by the p-n layer. For instance, in the p-n layer, a base layer 525 is grown, and an emitter layer 530 is grown adjacent to the base layer. The combination of the base layer and the emitter layer forms a heterojunction that acts as an absorber layer or p-n layer 533 for absorbing photons. In various embodiments, the emitter and base layers may be n-doped or $p^+$-doped in various combinations. For instance, in one embodiment, emitter layer 530 is a $p^+$-doped layer with a surface 537, and adjacently disposed base layer 525 is n-doped. In another embodiment, emitter layer 530 is an n-doped layer with surface 537, and adjacently disposed base layer 525 is $p^+$-doped. In particular, when light or photon energy is absorbed near the p-n layer 533 to produce electron-hole pairs, the built in electric field may force the holes to the n-doped side and electrons to the $p^+$-doped side. This displacement of free charges results in a voltage difference between the two layers in the p-n layer 533 such that electron current may flow when a load is connected across terminals or contact regions (not fully shown) coupled to these layers. The various thicknesses and relational dimensions of the multiple layers in device 500A of FIG. 5A, as well as the other figures in this Application, are not drawn to scales and may vary between devices.

A plurality of metal fingers (not shown) is disposed on a surface 537 of the semiconductor unit 533 for electrical conduction, as previously described above in relation to FIGS. 2A-C. Each of the metal fingers corresponding to a section of the optoelectronic electronic device, and more particularly to a section of the semiconductor unit 533. The metal fingers facilitate electrical conduction from the semiconductor unit 533. For instance, in the implementation of a p-n layer as the semiconductor unit 533, each metal finger is configured to collect electrical energy from a corresponding section of the p-n layer when excited by photons.

In addition, each of the metal fingers includes a landing pad area for forming an electrical contact. For instance pad area 570 is electrically connected to a metal finger disposed on surface 537 of the semiconductor unit. Also pad area 550 is electrically connected to another metal finger disposed on the surface 537. Also, the plurality of pad areas may be electrically connected together through any suitable means, such as, an external bus bar, leads, etc. That is, the plurality of pad areas is available for connection to an external or internal bus bar.

The optoelectronic device 500A includes a bad or defective section that may render the device inoperable, especially, when that bad section is electrically coupled to other operational sections of the device 500A through a bus bar. For instance, the bad section is located in the semiconductor layer 533 and is associated with a compromised metal finger and a compromised landing pad area. As an example, as shown in FIG. 5A, a bad section 593 is located in the proximity of compromised pad area 550 and its corresponding compromised metal finger (not shown).

A spot coating 590 of dielectric is disposed above the compromised pad area 550. By electrically isolating the compromised pad area 550 to eliminate electrical conduction from the corresponding compromised bad metal finger, the bad section 593 is also electrically isolated. In another embodiment, dielectric 590 is also disposed above the corresponding compromised metal finger. In that manner, the integrity of device 500A is restored.

Figure 5B:
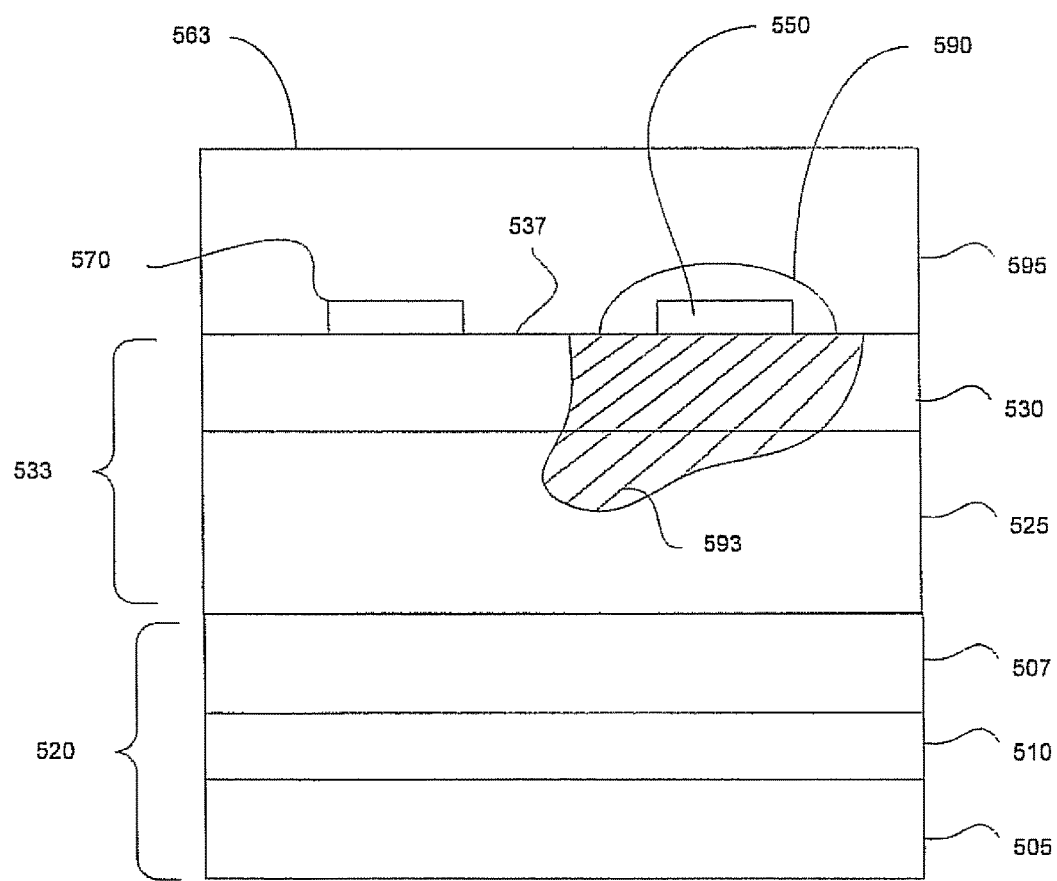
FIG. 5B is a cross-sectional view of an optoelectronic device including a back plate metal layer, and showing an isolated metal finger and the spot application of a dielectric disposed over a pad area associated with the isolated metal finger, in accordance with one embodiment of the present disclosure.

FIG. 5B is a cross-sectional view of the various layers of an optoelectronic device 500B including a back plate metal layer, and showing an isolated metal finger and the spot application of a dielectric 590 disposed over at least a pad area associated with the isolated metal finger, in accordance with one embodiment of the present disclosure. In some embodiments, the dielectric 590 is also disposed over the corresponding compromised metal finger. Device 500B may include a solar/photovoltaic device, a semiconductor device, an electronic device, etc.

For instance, the cross-section shown in FIG. 5B may be representative of a portion of the device 100C shown in FIG. 1C that is taken along lines A-A. In particular, FIG. 5B illustrates various epitaxial layers of the device 500B in cross-section during fabrication. The various layers may be formed using any suitable method for semiconductor growth, such as, molecular beam epitaxy, or metal-organic chemical vapor deposition, on a substrate (not shown). In particular, device 500B provides more detail for the various layers on device 500A of FIG. 5A.

For instance, device 500B includes a bus bar 595 that is disposed over and in connection with a plurality of pad areas disposed over the surface 537 of the semiconductor unit 533, including pad areas 570 and 550. In one embodiment, the bus bar 595 is incorporated within device 500B, such as, through another layer disposed adjacent to the plurality of pad areas. In another embodiment, the bus bar 595 is external to device 500B, and effectively may comprise a conductive material that is overlaid and connected to the plurality of pad areas. For instance, in one embodiment, the external bus bar 595 includes a metal layer of an overlaid optoelectronic device, as described below. In that manner, each of the plurality of pad areas that are not electrically isolated are electrically coupled together through the bus bar 595. Depending on the arrangement of optoelectronic devices 500B, current or voltage may be built.

As shown in FIG. 5B, landing pad area 550 is electrically isolated from the bus bar 595. Specifically, a spot coating 590 of dielectric is disposed over the compromised pad area 550 such that electrical access to the pad area 550 and its corresponding compromised metal finger is prevented. In some embodiments, the corresponding compromised finger metal is also electrically isolated with a coating of dielectric 590.

Device 500B also expands on layer 520 of device 500A of FIG. 5A. For instance, layer 520 may include buffer layers 505 and 507 surrounding a metal layer 510. These layers are disposed below the semiconductor unit 533, such as a p-n layer. In one embodiment, metal layer 510 may be electrically coupled to a plurality of landing pad areas of an underlying optoelectronic device. In that manner, the overlaid pads are configured in series for building voltage. As such, a fabric of optoelectronic devices is created, wherein the plurality of landing pad areas are all electrically coupled through corresponding metal layers.

Figure 5C:
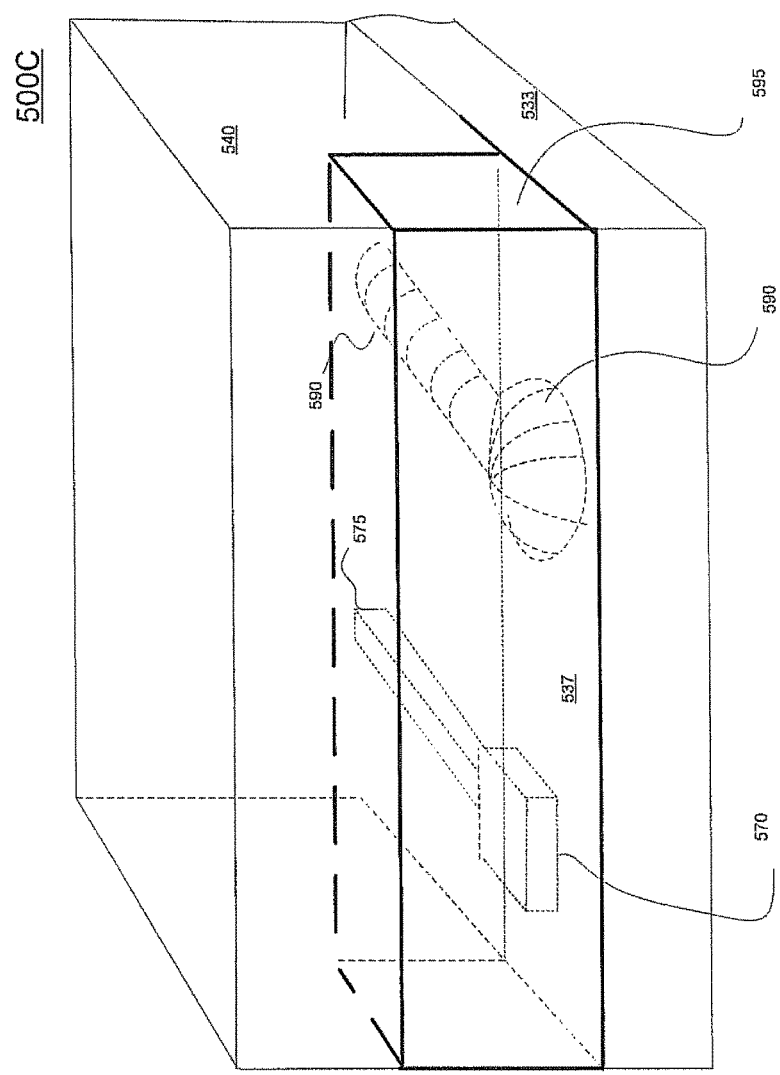
FIG. 5C is a perspective view of the optoelectronic device of FIG. 5B showing an isolated metal finger and the spot application of a dielectric disposed over a pad area associated with the isolated metal finger, in accordance with one embodiment of the present disclosure.

FIG. 5C is a perspective view of an optoelectronic device 500C showing an isolated and compromised metal finger and the spot application of a dielectric disposed over a compromised pad area, and in some embodiments to the corresponding compromised metal finger, that is associated with the isolated metal finger. Device 500C may include a solar/photovoltaic device, a semiconductor device, an electronic device, etc. More particularly, device 500C provides additional detail to the various layers in device 500B of FIG. 5B.

As shown, pad area 570 is connected to metal finger 575, wherein metal finger 575 is disposed on a surface 537 of semiconductor unit 533. In addition, compromised pad area 550 is encapsulated with a spot coating 590 of dielectric. Pad area 550 is hidden from view by the coating 590. Compromised pad area 550 is electrically connected to compromised metal finger. In some embodiments, the corresponding compromised finger metal is also electrically isolated with a coating of dielectric 590.

Additionally, bus bar 595 is shown disposed over the plurality of pad areas, to include pad area 570. Compromised pad area 550 is electrically isolated from the bus bar 595 because of the spot coating 590 of dielectric. In implementations where the compromised metal finger is coated with dielectric coating 590, the compromised metal finger is also electrically isolated from the bus bar 595. In that manner, the layout of the bus bar may encroach on a portion of the metal fingers, but is still electrically isolated from the compromised pad area 550 and compromised metal finger.

Also shown in FIG. 5C is a dielectric layer 540 disposed over the bus bar 595. Dielectric layer 540 may provide electrical isolation of the semiconductor unit 533 where exposed to layer 540. In another embodiment, layer 540 comprises an anti-reflective coating. As such, in a solar cell increased absorption of photon energy is achieved in the p-n layer of the semiconductor unit 533 through the application of the anti-reflective coating.

Figure 6:
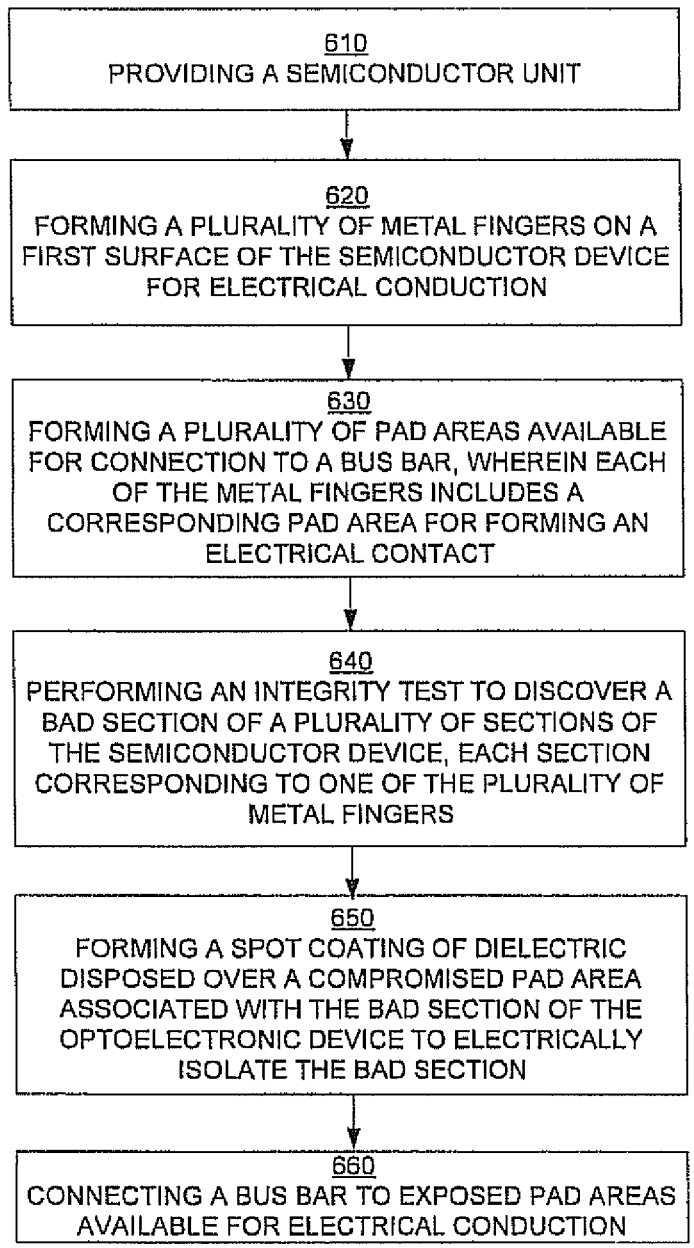
FIG. 6 is a flow chart of a method for fabricating a device including a segmented bus bar connected to a plurality of metal fingers and an isolated metal finger that is associated with a defect, in accordance with one embodiment of the present disclosure.

FIG. 6 is a flow chart 600 of a process used for fabricating an optoelectronic device (e.g., solar/photovoltaic device, a semiconductor device, an electronic device, etc.) that allows for an electrically conductive metal finger to be electrically isolated, in accordance with one embodiment of the present disclosure. In that manner, defects of the thin film stack material and/or device may be electrically isolated.

At 610, a first semiconductor unit is provided. In one embodiment, the first semiconductor unit comprises a p-n layer such that electrical energy is created when photons are absorbed by the p-n layer. The device may be representative of any optoelectronic device, such as, a semiconductor device, a photovoltaic device or solar cell, LED, etc.

At 620, a first plurality of metal fingers is formed on a first surface of the first semiconductor unit for electrical conduction. For instance, in the case where the first semiconductor unit comprises a p-n layer, the metal fingers provide electrical conduction so that electrical energy may be collected from the excitation of the p-n layer. Specifically, electron current may flow from the p-n layer in response to the absorption of photon energy through the plurality of metal fingers, when a load is connected to terminal or contact regions coupled to the layers of the p-n layer.

At 630, a plurality of landing pad areas is formed. Each of the pad areas is connected to a corresponding metal finger, and provides for forming an electrical contact that is associated with the metal finger. In that manner, connections can be made to the pad areas to electrically couple the metal fingers together. Further, the landing pad areas are available for connection to a bus bar (e.g., external or internal bus bar).

At 640, the operational integrity of the device is tested. In particular, an integrity test is performed to determine the operational integrity of a plurality of sections of the device. In particular, a bad section of the device is distinguished from a good section of the device, wherein each section of the device corresponds to one of the plurality of metal fingers. As such, through the test a defect in any section is readily discoverable through the performance of the integrity test. The bad or defective section is associated with a finger metal and corresponding pad area, identified as a compromised finger metal and a compromised pad area. Additionally, locational or dimensional characteristics are calculated in order to identify the location of the bad section, defect, corresponding compromised pad area, or corresponding compromised finger metal.

As previously described, various tests may be performed to check the operational integrity of the device. For instance, in embodiments, the device may be exposed to a photoluminescence operation to discover a bad section; or tested by electrically stimulating each of the plurality of metal fingers that are associated with the plurality of sections to identify a bad section; or tested by imaging the device to discover defects.

At 650, a spot coating of dielectric is disposed over a compromised pad area that is associated with the bad section of the first optoelectronic device. In particular, the spot coating encapsulates the exposed areas of the compromised pad area. In some embodiments, the corresponding compromised finger metal is also electrically isolated with the spot coating of dielectric. The spot coating electrically isolates the bad section, since electrical access to the compromised pad area and corresponding compromised metal finger is prevented. In that manner, isolation of the bad section, the compromised pad area and the compromised metal finger from the other pad areas and metal fingers is achieved.

In one embodiment, the plurality of pad areas is overlaid with a bus bar, such that the bus bar is in connection with the pad areas. The compromised pad area remains is electrically isolated from the bus bar because of the application of the spot coating of dielectric. In one embodiment, the bus bar is internal to the device. In another embodiment, the bus bar is external to the device.

In one embodiment, an external bus bar is included as a metal layer in another or second optoelectronic device. In one embodiment, the second optoelectronic device is configured similarly as the first optoelectronic device. For instance, the first optoelectronic electronic device is overlaid with a second optoelectronic device. The second optoelectronic device includes a second semiconductor unit. In addition, the second optoelectronic device includes a metal backing layer that is disposed under and electrically isolated from the second semiconductor unit. The metal backing layer functions as the bus bar to the pad areas of the first optoelectronic device, when electrically connected. Additionally, a buffer layer is disposed under the metal backing layer. A plurality of blind vias filled with electrically conductive material and providing electrical access to said metal backing layer acting as said bus bar, wherein said plurality of blind vias is aligned with said first plurality of pad areas, and wherein said metal layer is electrically isolated from said compromised pad area.

At 660, a bus bar is electrically connected to the exposed pad areas that are available for electrical conduction. As such, the compromised pad areas and corresponding metal fingers are electrically isolated from the bus bar.

Thus, according to embodiments of the present disclosure, devices and methods for converting electromagnetic radiation, such as, solar energy, into electrical energy that are able to isolate defective portions of a solar cell are described, so that remaining active portions of the solar cell may still be used for energy production.

While the foregoing disclosure sets forth various embodiments using specific block diagrams, flow charts, and examples, each block diagram component, flow chart step, operation, and/or component described and/or illustrated herein may be implemented, individually and/or collectively. In addition, any disclosure of components contained within other components should be considered as examples because many other architectures can be implemented to achieve the same functionality.

The process parameters and sequence of steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

The invention claimed is:

1. An optoelectronic device, comprising:
a semiconductor unit;
a plurality of metal fingers disposed on a surface of said semiconductor unit for electrical conduction, wherein each of said plurality of metal fingers corresponds to a section of said semiconductor unit, and wherein each of said plurality of metal fingers is electrically isolated from the other metal fingers;
a plurality of pad areas disposed on said surface of said semiconductor unit and available for connection to a bus bar, wherein each of said plurality of metal fingers is connected and adjacently disposed to a corresponding pad area of said plurality of pad areas for forming an electrical contact between the metal finger and the corresponding pad area,
wherein said semiconductor unit includes a bad section in proximity to a first metal finger of said plurality of metal fingers, wherein said bad section compromises said first metal finger and a corresponding first pad area of said plurality of pad areas; and
a dielectric spot coating disposed to cover said compromised first pad area and said compromised first metal finger while leaving remaining metal fingers and remaining pad areas completely uncovered by said dielectric spot coating, wherein said dielectric spot coating is operable to electrically isolate said bad section from said bus bar through isolation of said compromised first metal finger and said compromised first pad area from said bus bar.

2. The optoelectronic device of claim 1, wherein said bus bar is disposed over said plurality of pad areas, wherein said compromised first pad area is electrically isolated from said bus bar, and wherein said remaining pad areas are electrically connected to said bus bar.

3. The optoelectronic device of claim 2, further comprising:
a dielectric coating disposed over said compromised first metal finger and said bus bar.

4. The optoelectronic device of claim 2, wherein said dielectric spot coating comprises an anti-reflective coating.

5. The optoelectronic device of claim 1, wherein said semiconductor unit comprises a p-n layer such that electrical energy is created when photons are absorbed by said p-n layer.

6. The optoelectronic device of claim 5, further comprising:
a metal backing layer disposed below and electrically isolated from said p-n layer, wherein said metal backing layer is available for electrical coupling to another underlying optoelectronic device.

7. The optoelectronic device of claim 1, wherein:
the bus bar is disposed over the plurality of pad areas including the compromised first pad area covered by the dielectric spot coating, and
the optoelectronic device further comprises a dielectric layer disposed over the bus bar, the plurality of metal fingers including the compromised first metal finger covered by the dielectric spot coating, and portions of a top surface of the semiconductor unit.

8. An electronic device, comprising:
a first p-n layer of a first optoelectronic device such that electrical energy is created when photons are absorbed by said first p-n layer;
a first plurality of metal fingers disposed on a surface of said first p-n layer for electrical conduction, wherein each of said first plurality of metal fingers corresponds to a section of said first p-n layer, and wherein each of said first plurality of metal fingers is electrically isolated from the other metal fingers;
a first plurality of pad areas disposed on said surface of said first p-n layer and available for connection to an external bus bar, wherein each of said first plurality of metal fingers is adjacently disposed and connected to a corresponding pad area of said plurality of pad areas for forming an electrical contact between the metal finger and the corresponding pad area;
wherein the first p-n layer includes a bad section in proximity to a first metal finger of said first plurality of metal fingers, wherein said bad section compromises said first metal finger and a corresponding first pad area of said first plurality of pad areas; and
a dielectric spot coating disposed to cover said compromised first pad area and said compromised first metal finger while leaving remaining metal fingers and pad areas completely uncovered by said dielectric spot coating, wherein said dielectric spot coating is operable to electrically isolate said bad section from said external bus bar through isolation of said compromised first metal finger and said compromised first pad area from said external bus bar.

9. The electronic device of claim 8, wherein said external bus bar is disposed over said plurality of pad areas, wherein said compromised first pad area is electrically isolated from said external bus bar, and wherein said remaining pad areas are electrically connected to said external bus bar.

10. The electronic device of claim 8, further comprising:
a second optoelectronic device overlaid said first optoelectronic device, said second optoelectronic device comprising:
a semiconductor unit;
a metal backing layer disposed under and electrically isolated from said semiconductor unit;
a buffer layer disposed under said metal backing layer; and
a plurality of blind vias filled with electrically conductive material and providing electrical access to said metal backing layer acting as said external bus bar to said first plurality of pad areas of said first optoelectronic device, wherein said plurality of blind vias is aligned with said first plurality of pad areas, and wherein said metal backing layer is electrically isolated from said compromised first pad area.

11. The electronic device of claim 10, wherein:
said semiconductor unit comprises a second p-n layer such that electrical energy is created when photons are absorbed by said second p-n layer, and
said second optoelectronic device further comprises:
a second plurality of metal fingers disposed on a surface of said second p-n layer for electrical conduction, wherein each of said second plurality of metal fingers corresponds to a section of said second p-n layer, and wherein each of said second plurality of metal fingers is electrically isolated from the other metal fingers; and
a second plurality of pad areas disposed on the surface of said second p-n layer and available for connection to a bus bar different from the external bus bar, wherein each of said second plurality of metal fingers is adjacently disposed and connected to a corresponding pad area in said second plurality of pad areas for forming an electrical contact between the metal finger and the corresponding pad area.

12. The electronic device of claim 10, further comprising:
a dielectric coating disposed over front surfaces of each of said first optoelectronic device and said second optoelectronic device.

13. The electronic device of claim 8, wherein said first optoelectronic electronic device further comprises a metal backing layer disposed under and electrically isolated from said first p-n layer available for electrical coupling to another underlying optoelectronic device.

14. An optoelectronic device, comprising:
a semiconductor unit;
a plurality of metal fingers disposed on a surface of said semiconductor unit for electrical conduction, wherein each of said plurality of metal fingers corresponds to a section of said semiconductor unit, and wherein each of said plurality of metal fingers is electrically isolated from the other metal fingers;
a plurality of pad areas disposed on said surface of said semiconductor unit, wherein each of said plurality of metal fingers is connected and adjacently disposed to a corresponding pad area of said plurality of pad areas for forming an electrical contact between the metal finger and the corresponding pad area,
wherein said semiconductor unit includes a bad section in proximity to a first metal finger of said plurality of metal fingers, wherein said bad section compromises said first metal finger and a corresponding first pad area of said plurality of pad areas; and
a dielectric layer disposed to cover said plurality of pad areas, wherein said compromised first pad area is isolated from a bus bar by said dielectric layer, and wherein each remaining pad area of said plurality of pad areas has a corresponding and separate blind via formed in said dielectric layer through which said remaining pad area is available to electrically connect to said bus bar using electrically conductive material disposed within the blind via.

\* \* \* \* \*